(12) United States Patent
Holcomb (10) Patent No.: US 9,072,198 B2
(45) Date of Patent: Jun. 30, 2015

(54) VARIABLE IMPEDANCE DEVICE WITH INTEGRATED REFRIGERATION

(75) Inventor: Matthew J. Holcomb, Metamora, MI (US)

(73) Assignee: Grid Logic Incorporated, Metamora, MI (US)

(*) Notice: Subject to any disclaimer, the term of this patent is extended or adjusted under 35 U.S.C. 154(b) by 555 days.

(21) Appl. No.: 13/418,317

(22) Filed: Mar. 12, 2012

(65) Prior Publication Data

US 2012/0229959 A1 Sep. 13, 2012

Related U.S. Application Data (60) Provisional application No. 61/451,967, filed on Mar. 11, 2011, provisional application No. 61/507,998, filed on Jul. 14, 2011.

(51) Int. Cl.
| | |
|---|---|
| *F25B 9/00* | (2006.01) |
| *H05K 7/20* | (2006.01) |
| *F25B 9/02* | (2006.01) |
| *F25B 9/14* | (2006.01) |
| *H01L 39/16* | (2006.01) |

(52) U.S. Cl.
CPC ........ *H05K 7/20372* (2013.01); *Y10T 29/49359* (2015.01); *Y10T 29/49002* (2015.01); *H01L 39/16* (2013.01); *F25B 9/02* (2013.01); *F25B 9/145* (2013.01)

(58) Field of Classification Search
USPC .......... 62/6; 361/676, 699; 29/890.035, 259.1
See application file for complete search history.

(56) References Cited

U.S. PATENT DOCUMENTS

| | | | | |
|---|---|---|---|---|
| 3,704,600 A | * | 12/1972 | Prast et al. | .................... 62/457.9 |
| 5,339,649 A | | 8/1994 | Kawai et al. | |
| 6,664,875 B2 | * | 12/2003 | Yuan et al. | .................... 335/216 |
| 2006/0122067 A1 | | 6/2006 | Holcomb | |

OTHER PUBLICATIONS

International Application No. PCT/US2012/028835, International Filing Date: Mar. 12, 2012, International Search Report and Written Opinion mailed on Jul. 5, 2012.

* cited by examiner

*Primary Examiner* — Melvin Jones
(74) *Attorney, Agent, or Firm* — Stephen M. De Klerk (57) ABSTRACT

The invention provides a variable impedance device including a first bus bar refrigeration system, a first bus bar thermally connected to the first bus bar refrigeration system to be maintained at a target bus bar temperature by the first bus bar refrigeration system, a variable impedance component refrigeration system, a variable impedance component electrically connected to the first bus bar and thermally connected to the component refrigeration system, a variable impedance component may be at least partially made of a material that is superconducting below a critical temperature and may be maintained at a target component temperature, wherein the target bus bar temperature may be between the 300K and critical temperature and the target component temperature may be below the critical temperature and a second bus bar connected to the variable impedance component so that current flows between the first and second leads through the variable impedance component.

27 Claims, 10 Drawing Sheets

VARIABLE IMPEDANCE DEVICE WITH INTEGRATED REFRIGERATION

CROSS-REFERENCE TO RELATED APPLICATIONS

This application claims priority from U.S. Provisional Patent Application No. 61/451,967, filed on Mar. 11, 2011 and, U.S. Provisional Patent Application No. 61/507,998, filed on Jul. 14, 2011 each of which is incorporated herein by reference in their entirety.

BACKGROUND OF THE INVENTION

1). Field of the Invention

This invention relates to a variable impedance device, components thereof and methods of manufacturing the same.

2). Discussion of Related Art

Variable impedance devices are often used within circuits to control current. For example, in a power circuit such as an electric grid where a current can cause high power breakers to trip resulting in temporary or long-term blackouts, a variable impedance device can be used to limit the over current and maintain power flow in the grid.

A variable impedance device usually includes first and second bus bars, a variable impedance component connected between the leads and a component refrigeration system to cool the variable impedance component to below a critical temperature wherein the variable impedance component becomes superconducting. An over current causes the superconducting variable impedance component to transition rapidly to a resistive state, which subsequently heats the variable impedance component to a temperature above the critical current temperature. The variable impedance component; acts like a fast switch that is thermally latched by the over current condition. This switch, in an electric power grid circuit, can rapidly insert impedance (e.g. resistive, inductive, capacitive or a combination) so that the variable impedance component increases the impedance of the circuit during the over current condition and thereof limits the magnitude of the over current.

A refrigeration system can also be used to cool the bus bars. Both bus bars may for example be immersed in a cryogenic bath that reduces their temperature from atmospheric temperature (e.g., 300K) close to terminals of the bus bars to a temperature closer to the critical current temperature at locations closer to the variable impedance component. Such a bath requires a large amount of cooling power. Such a bath also does not allow for more precise cooling of specific locations on a bus bar, which makes it difficult to precisely engineer materials and component configurations along a length of a bus bar. A bath is also impractical in moving structures such as vehicles or rotating arrangements of the kind found in motors and generators.

SUMMARY OF THE INVENTION

The invention provides a variable impedance device including a first bus bar refrigeration system, a first bus bar thermally connected to the first bus bar refrigeration system to be maintained at a target bus bar temperature by the first bus bar refrigeration system, a variable impedance component refrigeration system, a variable impedance component electrically connected to the first bus bar and thermally connected to the component refrigeration system, a variable impedance component may be at least partially made of a material that is superconducting below a critical temperature and may be maintained at a target component temperature, wherein the target bus bar temperature may be between the 300K and critical temperature and the target component temperature may be below the critical temperature and a second bus bar connected to the variable impedance component so that current flows between the first and second leads through the variable impedance component.

The variable impedance device may further include that the first bus bar refrigeration system may be a high-temperature first bus bar refrigeration system thermally connected to a high-temperature lead of the first bus bar, further including a low-temperature first bus bar refrigeration system thermally connected to a low-temperature lead of the first bus bar, the high temperature lead may be maintained at a high target temperature and the low-temperature lead may be maintained at a low target temperature by the high-temperature first bus bar refrigeration system and the low-temperature first bus bar refrigeration system respectively.

The variable impedance device may further include that the variable impedance component refrigeration system may be a hydrogen Joule-Thomson expansion refrigeration system and the low-temperature first bus bar refrigeration system may be a nitrogen Joule-Thomson refrigeration system.

The variable impedance device may further include that the high-temperature first bus bar refrigeration system may be selected from the group consisting of a mixed gas refrigeration system, a pulse tube refrigeration system, and a Gifford-McMahon refrigeration system.

The variable impedance device may further include that the first bus bar may have a fluid passage therethrough and the first bus bar refrigeration system may be a closed cycle system with the fluid passage forming part of the closed cycle.

The variable impedance device may further include that the first bus bar may include an electrically conductive body with a first channel formed in a first surface of the body and a first sealing plate over the first surface of the body, the passage having a first portion jointly defined by the channel in the first surface and a surface of the first sealing plate.

The variable impedance device may further include that the body may have a second channel formed in a second opposing surface thereof, the first bus bar may further include a second sealing plate over the second surface of the body, the passage having a second portion jointly defined by the channel in the second surface and a surface of the second sealing plate.

The variable impedance device may further include an expansion port in the fluid passage to form a cryocooler.

The variable impedance device may further include that the variable impedance component refrigeration system may include a heat exchanger with a fluid passage formed therein, the fluid passage having first and second portions and an expansion valve connection the first and second portions to form a cryocooler.

The variable impedance device may further include that the first and second portions of the passage may be coils.

The variable impedance device may further include that a section of the second portion of the fluid passage may be located between two sections of the first portion of the fluid passage.

The variable impedance device may further include that the first portion of the fluid passage may coil inwards towards a center point and the second portion of the fluid passage may coil outward from the center point.

The variable impedance device may further include that the expansion port may be located at the center point.

The variable impedance device may further include that the heat exchanger may further include a body with a channel formed therein and a capping component on the body, the fluid passage being defined by the channel and a surface of the capping component.

The variable impedance device may further include that the material of the variable impedance component may be deposited on the heat exchanger.

The variable impedance device may further include a second bus bar refrigeration system, the second bus bar may be thermally connected to the second bus bar refrigeration system to be maintained at the target bus bar temperature.

The variable impedance device may further include that the second bus bar refrigeration system may be a high-temperature second bus bar refrigeration system thermally connected to a high-temperature lead of the second lead, further including a low-temperature second bus bar refrigeration system thermally connected to a low-temperature lead of the second lead, the high temperature lead may be maintained at a high target temperature and the low-temperature lead may be maintained at a low target temperature by the high-temperature second bus bar refrigeration system and the low-temperature second bus bar refrigeration system respectively.

The variable impedance device may further include that the variable impedance component refrigeration system may be is one of a hydrogen Joule-Thomson expansion refrigeration system and a helium Pulse Tube refrigeration system.

The invention further provides a method of varying a magnitude of current, including maintaining a first bus bar at a first temperature using a first refrigeration system, maintaining a variable impedance component that may be at least partially made of a material that is superconducting below a critical temperature at a second temperature, the first temperature being between 300K and the critical temperature and the second temperature being below the critical temperature, passing current between the first and a second bus bar through the variable impedance component connected between the first and second leads and increasing an impedance of the variable impedance component so that the current switches from superconducting current to resistive current through the variable impedance component.

The invention also provides a current carrying component including a lead having a fluid passage therethrough, the fluid passage having an inlet port into the lead and an outlet port out of the lead.

The current carrying component may further include that the lead may include an electrically conductive body with a first channel formed in a first surface of the body and a first sealing plate over the first surface of the body, the passage having a first portion jointly defined by the channel in the first surface and a surface of the first sealing plate.

The current carrying component may further include that the body may have a second channel formed in a second opposing surface thereof, the lead may further include a second sealing plate over the second surface of the body, the passage having a second portion jointly defined by the channel in the second surface and a surface of the second sealing plate.

The current carrying component may further include an expansion port in the fluid passage to form a cryocooler.

The current carrying component may further include that the lead may be made of copper.

The current carrying component may further include that the lead may be made of $MgB_2$.

The invention further provides a method of making a current carrying component, including forming a lead having a fluid passage therethrough, the fluid passage having an inlet port into the lead and an outlet port out of the lead.

The method may further include forming a first channel in a first surface of an electrically conductive body and first portion defined by the channel in the first surface and a surface of the first sealing plate.

The method may further include that the body may have a second channel formed in a second opposing surface thereof, the method further including securing a second sealing plate over the second surface of the body, the passage having a second portion defined by the channel in the second surface and a surface of the second sealing plate.

The method may further include forming an expansion port in the fluid passage.

The method may further include that the lead may be made of copper.

The method may further include that the lead may be made of $MgB_2$.

The invention also provides a cryocooler including a heat exchanger having a fluid passage formed therein, the fluid passage having first and second portions, each portion being in the form of a respective coil and an expansion valve connecting the first and second portions.

The cryocooler may further include that a section of the second portion of the fluid passage may be located between two sections of the first portion of the fluid passage.

The cryocooler may further include that the first portion of the fluid passage may coil inwards towards a center point and the second portion of the fluid passage may coil outward from the center point.

The cryocooler may further include that the expansion port may be located at the center point.

The invention further provides a method of making a cryocooler including forming a channel in a body, the channel having first and second portions, each portion being in the form of a respective coil, forming an expansion valve connecting the first and second portions and securing a capping component to the body, so that a fluid passage is formed jointly by the channel and a surface of the capping component.

The invention also provides a variable impedance subsystem including at least a first configuration including a cryocooler having a heat exchanger with a fluid passage formed therein, the fluid passage having first and second portions, each portion being in the form of a respective coil, an expansion valve connecting the first and second portions and a variable impedance component on the cryocooler, the variable impedance component at least partially made of a material that is superconducting below a critical temperature.

The variable impedance subsystem may further include that the material may be $MgB_2$.

The invention further provides a method of making a variable impedance subsystem, including depositing a material on a cryocooler, the material being superconducting below a critical temperature.

The method may further include forming a channel in a body of the cryocooler, forming an expansion port in the channel and securing a capping component over the channel so that the channel and a surface of the capping component form a passage having first and second portions with the expansion port connecting the portions.

The invention also provides a variable impedance subassembly including a plurality of cooled variable impedance configurations adjacent one another, each configuration including a heat exchanger and a variable impedance component in thermal contact with the heat exchanger, the variable impedance component may be made of a material that is superconducting at a critical temperature and the heat exchanger may be configured to cool the variable impedance component to below the critical temperature, and at least one electrically conductive link connecting the variable impedance component of a first of the configurations with the variable impedance component of a second of the configurations.

The variable impedance subassembly may further include that the variable impedance component of each configuration may be in the form of at least one spiral coil.

The variable impedance subassembly may further include first, second and third of said configurations and first and second electrically conductive links, wherein the first electrically conductive link may connect a center of the spiral coil of the first configuration with a center of the spiral coil of the second configuration, and the second electrically conductive coil may connect an outer portion of the spiral coil of the second configuration with an outer portion of the spiral coil of the third configuration.

The variable impedance subassembly may further include that a magnetic flux field of the spiral coil of a first of the configurations may oppose a magnetic flux field of a spiral coil of the second configuration.

The variable impedance subassembly may further include that the variable impedance component of each configuration may be in a bifilar configuration with first and second spirals in a common plane.

BRIEF DESCRIPTION OF THE DRAWINGS

The invention is further described by way of examples with reference to the accompanying drawings, wherein.

DETAILED DESCRIPTION OF THE INVENTION

Figure 1:
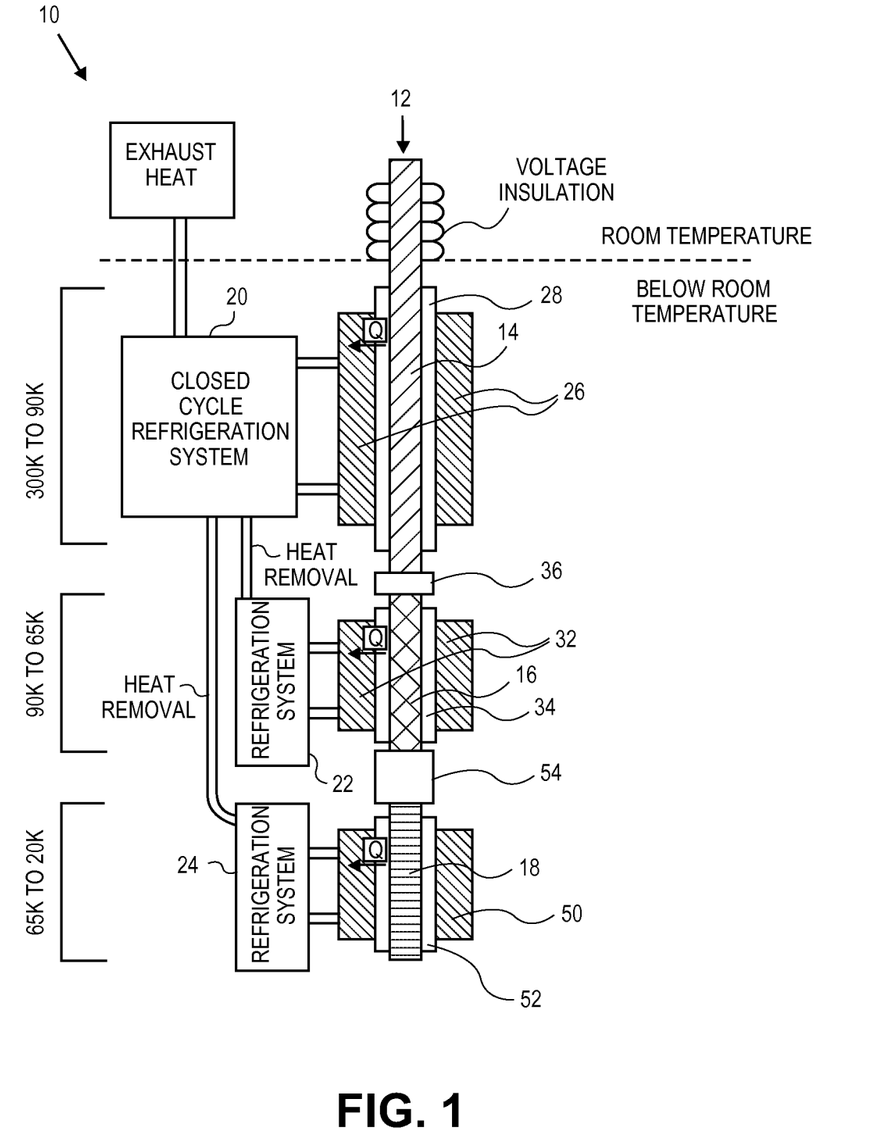
FIG. 1 is a partially cross-sectioned and partially schematic view of a portion of a variable impedance device according to an embodiment of the invention.

FIG. 1 of the accompanying drawings illustrates a variable impedance device 10, according to an embodiment of the invention, including a first bus bar 12 having a high-temperature lead 14 and a low-temperature lead 16, a variable impedance component 18, a high-temperature first bus bar refrigeration system 20, a low-temperature first bus bar refrigeration system 22, and a variable impedance component refrigeration system 24.

The high-temperature lead 14 of the bus bar 12 is typically made of copper. The high-temperature first bus bar refrigeration system 20 includes a heat exchanger 26. The heat exchanger 26 is thermally coupled to the high-temperature lead 14 by an electrically insulating, thermally conductive material 28 such as $Al_2O_3$. The high-temperature first bus bar refrigeration system 20 is thus thermally coupled to the high-temperature lead 14 of the first bus bar 12 so that heat (represented by Q) can conduct from the copper of the high-temperature lead 14 through the material 28 to the heat exchanger 26.

The high-temperature first bus bar refrigeration system 20 is typically a Gifford-McMahon, Pulse Tube, or mixed gas, single-stream throttle expansion Kleemenko refrigeration system. The high-temperature first bus bar refrigeration system 20 is thus a closed cycle refrigeration system capable of providing high refrigeration capabilities at temperatures in excess of approximately 90K. High electrical conductivity is usually associated with high thermal conductivity and a high heat flux then exists in the high-temperature lead 14 of the first bus bar 12, especially if it is made of copper or aluminum.

Figure 2:
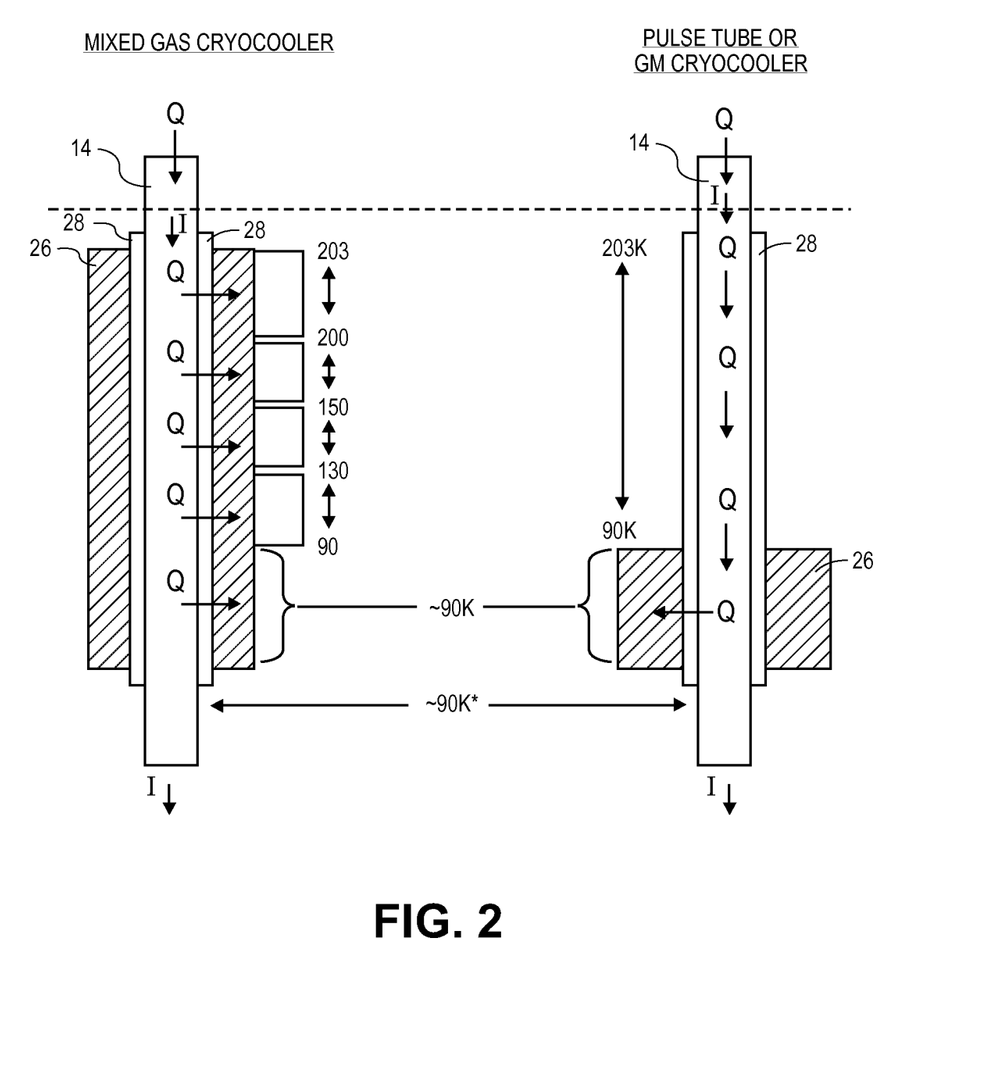
FIG. 2 shows cross-sectional side views of two types of cryocoolers that can form a high temperature first bus bar refrigeration system of the variable impedance device.

FIG. 2 shows a schematic of copper current leads that are cryogenically cooled with a mixed gas, a Pulse Tube, or a Gifford-McMahon cooler. A significant difference in the two methods of cooling is that the mixed gas, single-stream throttle expansion cryocooler removes heat along the entire length of the lead, and the Pulse Tube/Gifford-McMahon scheme only removes heat at the lowest temperature of aperture. The high-temperature lead 14 is thus held at a high target temperature of approximately 90K.

Figure 3:
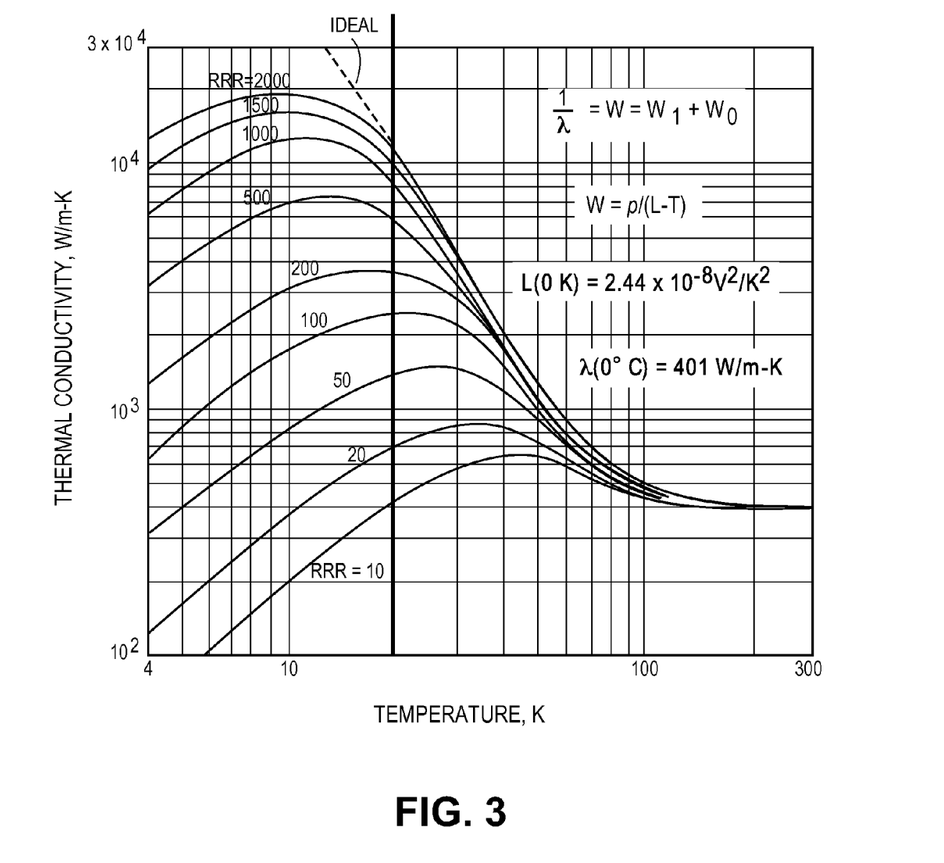
FIG. 3 is a graph illustrating thermal conductivity of copper as a function temperature.

FIG. 3 shows the thermal conductivity of high purity copper metal. For Residual Resisting Ratios of 100, it is seen that the thermal conductivity of copper increases nearly an order of magnitude at 20 k as compared to 300K. As copper cools, there is a dramatic reduction in thermal resistance and an associated decrease in the electrical resistance, which then reduces the cryogenic requirements of the lead assembly as the temperature is reduced along the length of the copper lead.

Referring again to FIG. 1, the low-temperature first bus bar refrigeration system 22 includes a heat exchanger 32 and is connected to the low-temperature lead 16 of the first bus bar 12 with a material 34 similar to the material 28. The low-temperature lead 16 of the first bus bar 12 is made of a high-temperature superconductor (HTS) material that is superconducting at temperatures below 90K. The low-temperature lead 16 is connected to the high-temperature lead 14 with an electrical connection 36.

The low-temperature first bus bar refrigeration system 22 is preferably a nitrogen Joule-Thomson expansion refrigeration system in which high pressure nitrogen gas is allowed to expand to low pressure under constant enthalpy. An upper end of the low-temperature lead 16 of the first bus bar 12 is at the same temperature as the lower end of the high-temperature lead 14 of the first bus bar 12, i.e. at approximately 90K. The low-temperature first bus bar refrigeration system 22 removes heat from the low-temperature lead 16 so that a lower end of the low-temperature lead 16 is at approximately 65K.

Figure 4:
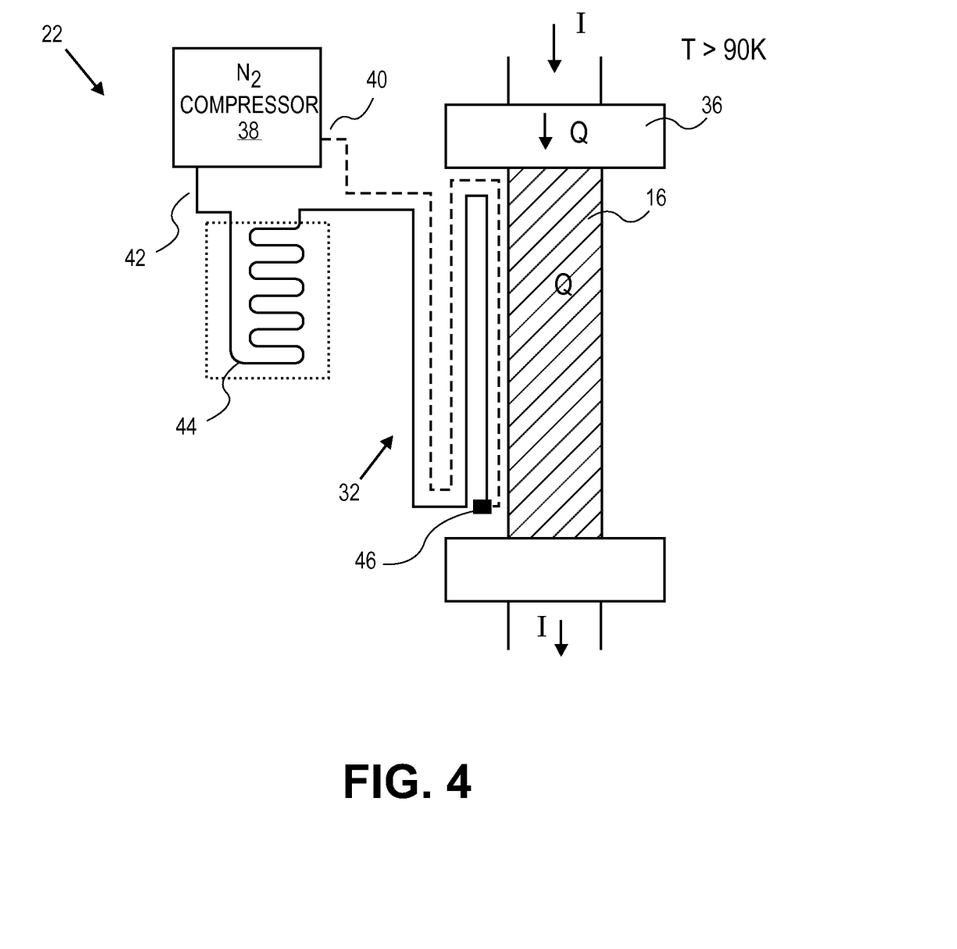
FIG. 4 is a partially cross-sectioned and partially schematic side view of a low temperature first bus bar refrigeration system that can form part of the variable impedance device.

As illustrated in FIG. 4, the low-temperature first bus bar refrigeration system 22 includes a nitrogen compressor 38 with a low-pressure side 40 and a high-pressure side 42, and a heat exchanger 44 in addition to the heat exchanger 32. The low-pressure first bus bar refrigeration system 22 is a closed cycle system, wherein the compressor 38, heat exchanger 44 and heat exchanger 32 are located in line after one another in a closed path. A Joule-Thomson expansion valve 46 is incorporated in the flow of the heat exchanger 32.

The compressor 38 compresses nitrogen gas and the nitrogen gas is then provided under high pressure to the heat exchanger 44. Heat generated during compression of the nitrogen gas is removed by the heat exchanger 44. The heat exchanger 44 then has an outlet that is maintained at approximately 90K. The nitrogen leaving the heat exchanger 44 follows a meandering path under high pressure through the heat exchanger 32, and is then expanded by the Joule-Thomson expansion valve 46. After leaving the Joule-Thomson expansion valve 46, the nitrogen has expanded under constant enthalpy so that its temperature decreases. The nitrogen gas at the decreased temperature then pre-cools nitrogen gas entering the heat exchanger 32 before it reaches the Joule-Thomson expansion valve 46. The pre-cooling of the nitrogen gas may ultimately cause liquification of the nitrogen gas to cause more heat to be convected thereto from the low-temperature lead 16 of the first bus bar 12.

As further shown in FIG. 1, the variable impedance component refrigeration system 24 has a heat exchanger 50 that is thermally connected to the variable impedance component 18 with a material 52 that is similar to the material 28 and 34. The variable impedance component 18 is connected to an end of the low-temperature lead 16 of the first bus bar 12 with an electrical connection 54 similar to the electrical connection 36.

The variable impedance component refrigeration system 24 is typically a hydrogen Joule-Thomson expansion refrigeration system or a helium Pulse Tube refrigeration system. The variable impedance component refrigeration system 24 is capable of cooling the variable impedance component 18 to a temperature below the critical temperature of the superconducting (in this example $MgB_2$) of the variable impedance component 18.

Figure 5:
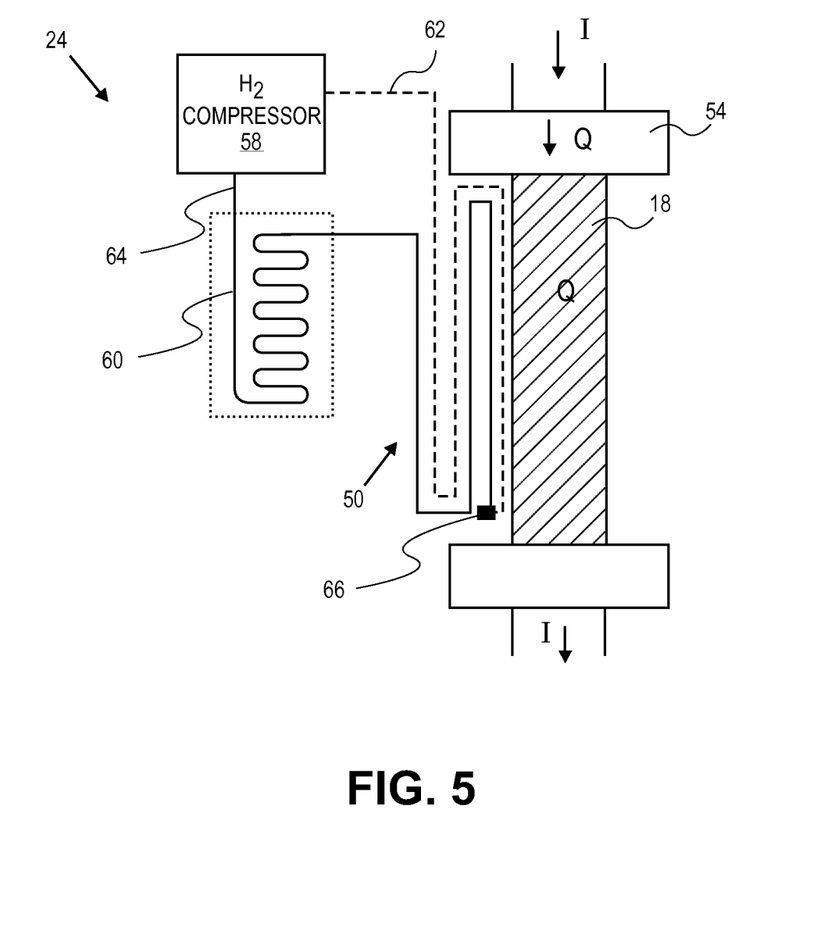
FIG. 5 is a partially cross-sectioned and partially schematic side view of a variable impedance component refrigeration system that can form part of the variable impedance device.

FIG. 5 illustrates that the variable impedance component refrigeration system 24 includes a hydrogen compressor 58 and a heat exchanger 60 in addition to the heat exchanger 50. The compressor 58 has a low-pressure side 62 and a high-pressure side 64. Hydrogen gas leaving the compressor 58 is cooled by the heat exchanger 60. In the example illustrated in FIG. 1, the heat dissipated by the heat exchanger 60 is provided to the high-temperature first bus bar refrigeration system 20. As such, the hydrogen gas is cooled by the heat exchanger 60 to approximately 90K. In an alternative embodiment, the heat that is dissipated by the heat exchanger 60 may be provided to the low-temperature first-bus bar refrigeration system 22 in FIG. 1, in which case the hydrogen gas can be cooled to approximately 65K by the heat exchanger 60.

Referring again to FIG. 5, hydrogen gas leaving the heat exchanger 60 follows a meandering path through the heat exchanger 50 and is expanded by a Joule-Thomson expansion valve 66, whereafter the hydrogen gas follows a meandering path out of the heat exchanger 50. The hydrogen gas is expanded by the Joule-Thomson expansion valve 66 under constant enthalpy, so that the temperature of the hydrogen gas decreases as its pressure reduces. The hydrogen gas at the decreased temperature then pre-cools hydrogen gas entering the heat exchanger 50 before it reaches the Joule-Thomson expansion valve 66. The pre-cooling of the hydrogen gas may ultimately cause liquification of the hydrogen gas to cause more heat to be convected thereto from variable impedance component 18.

Figure 6:
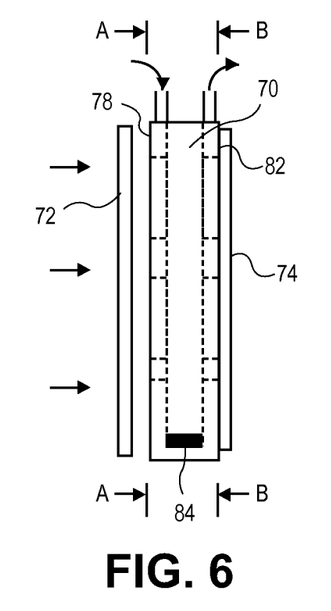
FIG. 6 is an end view of a high temperature lead of a first bus bar of the variable impedance device.
Figure 7:
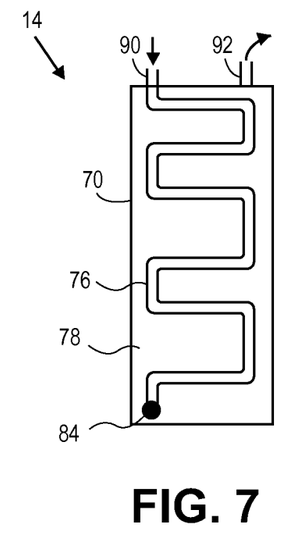
FIG. 7 is a cross-sectional side view on A-A in FIG. 6.
Figure 8:
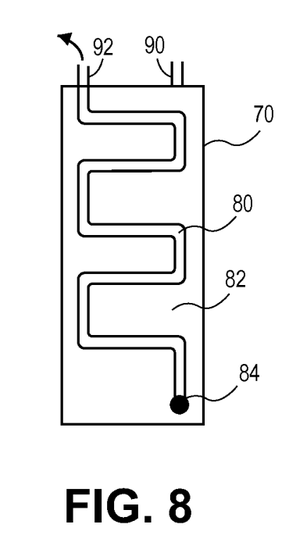
FIG. 8 is a cross-sectional side view on B-B in FIG. 6.

As shown in FIGS. 6, 7 and 8, the high-temperature lead 14 of the bus bar 12 in FIG. 1 preferably has an integrated heat exchanger instead of a separate heat exchanger such as the heat exchanger 26 in FIG. 1. The high-temperature lead 14 includes an electrically conductive body 70 made of copper and first and second sealing plates 72 and 74. As more particularly shown in FIG. 7, the electrically conductive body 70 has a first channel 76 formed in a first surface 78 thereof. As further shown in FIG. 8, the electrically conductive body 70 has a second channel 80 formed in a second opposing surface 82 thereof. As illustrated in both FIGS. 7 and 8, a Joule-Thomson expansion port or a mixed gas, single-stream throttle expansion port 84 connects the channels 76 and 80. The channels 76 and 80 may for example be milled into the surfaces 78 and 82. The expansion port 84 may be drilled through the electrically conductive body 70 to connect the channels 76 and 80 to one another.

As shown in FIG. 6, the sealing plates 72 and 74 are located on the surfaces 78 and 82 respectively and are then welded or otherwise secured to the electrically conductive body 70 in a manner that creates a suitable seal between the respective sealing plate 72 or 74 and the respective surface 78 and 82. A sealed passage is then defined through the high-temperature lead 14. A first portion of the passage is defined jointly by the channel 76 and a surface of the sealing plate 72. A second portion of the passage is defined by the channel 80 and a surface of the sealing plate 74.

High pressure gas enters the passage through an inlet port 90 and low pressure gas leaves the passage through an outlet port 92. The passage forms part of the closed cycle refrigeration system 20 in FIG. 1.

For alternating current power applications, the high-temperature lead 14 should be designed to maximize the current flow and minimize the transfer of heat from ambient temperature. The total width of the high-temperature lead 14 should be approximately two times the skin depth of the conductive material at the frequency of the alternating current. The dimensions of the high-temperature lead 14 are approximate because some cross-sectional areas of the electrically conductive body 70 are empty due to the presence of the integrated heat exchanger. In general, it is desirable to optimize the width of the electrically conductive body 70 to minimize resistive losses due to $i^2R$ and to minimize heat conduction due to the ambient connection.

It can thus be seen that the high-temperature lead 14 serves multiple purposes. One purpose of the high-temperature lead 14 is to conduct current. It can also be seen that no separate heat exchanger is required because the high-temperature lead 14 is used to convect heat directly from itself to a fluid flowing therethrough. The high-temperature lead 14 is also a cryocooler that expands the gas at the single-stream, throttle expansion port 84 and pre-cools as hereinbefore described.

Figure 9:
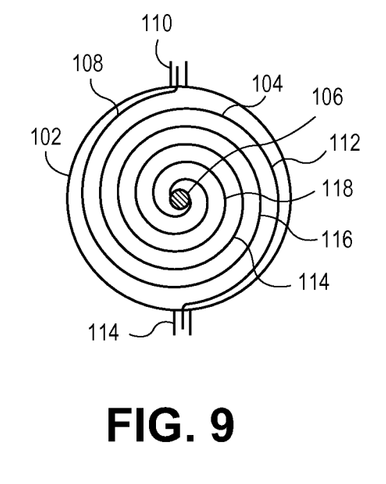
FIG. 9 is top plane view of a body of a cryocooler of the variable impedance component refrigeration system.
Figure 10:
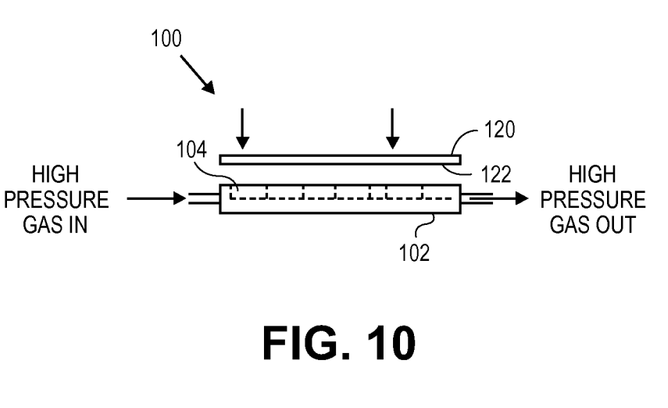
FIG. 10 is a side view of the body and an insulating layer which jointly form the cryocooler.
Figure 11:
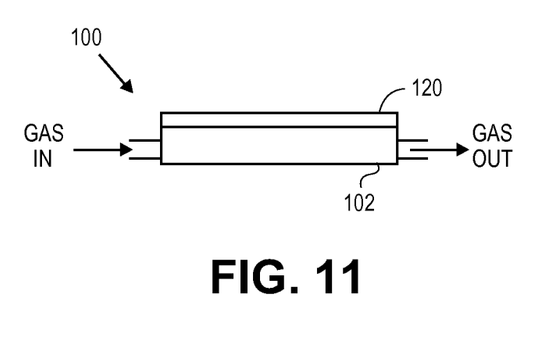
FIG. 11 is a view similar to FIG. 10 after the insulating layer is secured to the body.

FIGS. 9, 10 and 11 illustrate the fabrication of a cryocooler 100 that is suitable for cooling the variable impedance component 18 in FIG. 1 and can be used instead of the heat exchanger 50 in FIG. 1. As shown in FIG. 1, the cryocooler includes a body 102 having a channel 104 and an expansion port 106 formed therein. The channel 104 has a first portion 108 that coils inwardly from an inlet port 110 to a center point where the expansion port 106 is located. The channel 104 also has a second portion 112 that coils outwardly from the center point where the expansion port 106 is located to an outlet port 114. The expansion port 106 connects the first and second portions 108 and 112 to one another. The channel 104 typically has a pre-determined width and depth and the expansion port 106 forms a narrowing within the channel 104 and has a smaller cross-sectional area than the channel 104.

When finally fabricated, high pressure gas enters the inlet port 110 and then flows inwardly towards the expansion port 106 where it is expanded. The expanded gas then flows outwardly from the expansion port 106 to the outlet port 114. The first and second portions 108 and 112 are located within one another such that a section 114 of the second portion 112 is located between the sections 116 and 118 of the first portion 108. A fluid flowing outwardly through the section 114 can thus be used to pre-cool a fluid flowing inwardly through the sections 116 and 118.

Figure 12:
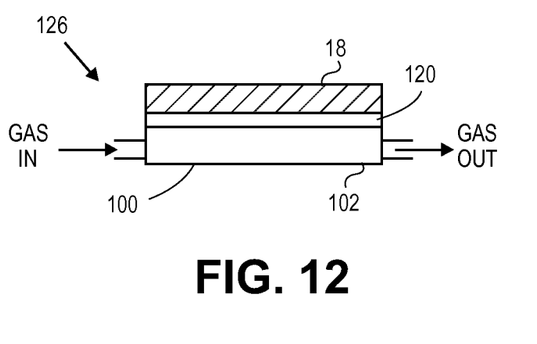
FIG. 12 is a view similar to FIG. 11 after a superconducting material is deposited to form the variable impedance component on the cryocooler.

As shown in FIG. 10, the cryocooler 100 further includes a capping component 120. The capping component 120 is made of a thermally conducting material. The capping component 120 can be made of an electrically insulating or electrically conducting material. A lower surface 122 of the capping component 120 is located above the channel 104. As shown in FIG. 11, the capping component 120 is then secured to the body 102 in a manner that causes a suitable seal between the surface 122 and an upper surface of the body 102. A passage is thereby defined jointly by the channel 104 and the lower surface 122 of the capping component 120. The shape of the passage is defined by the shape of the channel 104, FIG. 12 illustrates a variable impedance subsystem 126 that includes the cryocooler 100 and the variable impedance component 18. The variable impedance component 18 is in the form of material that is deposited on the capping component 120. Various material deposition techniques may be used for depositing the material of the variable impedance component 18.

Figure 13:
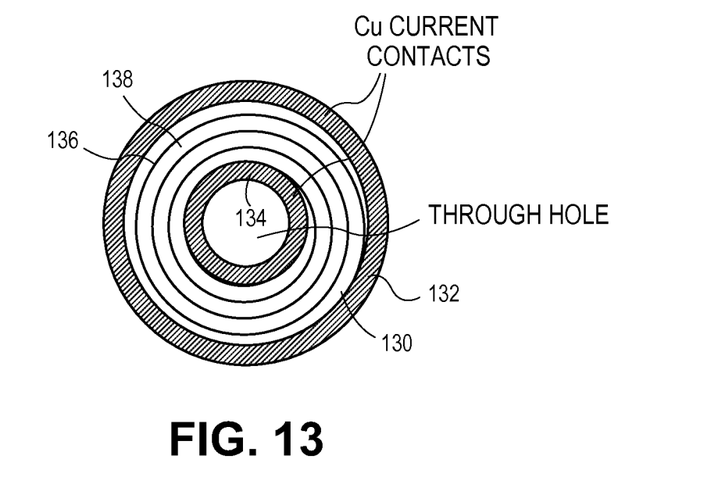
FIG. 13 is a top plan view of a variable impedance component according to one embodiment of the invention.

FIG. 13 illustrates a variable impedance component 130 and first and second copper contacts 132 and 134, respectively. The variable impedance component 130 is fabricated in the form of a planar spiral coil 136 with a gap 138 defined between successive revolutions of the coil. The gap 138 may also be filled with a non-conductive dielectric material. The first copper contact 132 is formed on an external perimeter of the variable impedance component 130. The second copper contact 134 is formed on an inner diameter defined by the variable impedance component 130. The copper contacts 132 and 134 are connected to one another through the variable impedance component 130.

Figure 14:
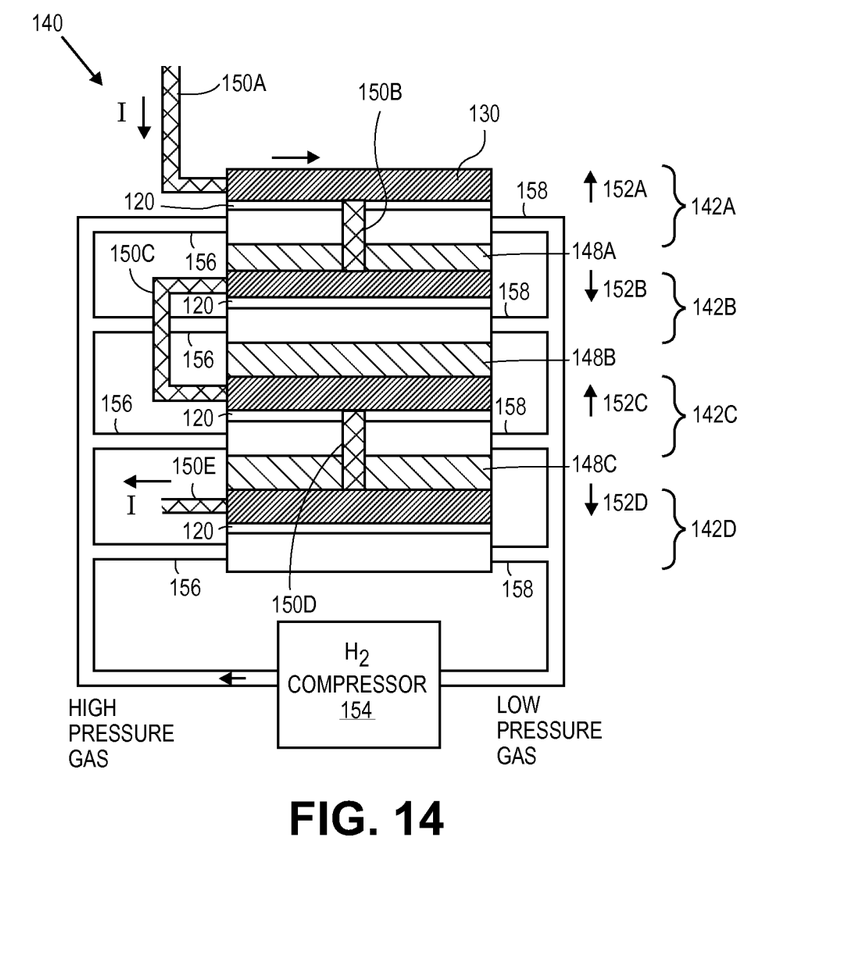
FIG. 14 is a cross-sectional side view of a variable impedance subassembly that includes a plurality of cooled variable impedance configurations, each including a respective variable impedance component of the kind illustrated in FIG. 13.

FIG. 14 illustrates a variable impedance subassembly 140 that has a plurality of cooled variable impedance configurations 142A-D. Each variable impedance configuration 142A-D has a respective variable impedance component 130 such as the variable impedance component 130 in FIG. 13 together with its respective contacts 132 and 134 (not shown in FIG. 14). Each configuration 142A-D further has a capping component 120 such as the capping component 120 in FIG. 12 and a respective cryocooler 100 such as the cryocooler 100 in FIG. 12. The variable impedance configurations 142A-D are separated from one another by a respective separation layer 148A-C.

The variable impedance subsystem 126 further has first through fifth joints 150A-E. The first joint 150A is connected to the first contact 132 (see FIG. 13) of the variable impedance component 130 of the first configuration 142A. The second joint 150B is connected to the second contact 134 (see FIG. 13) of the variable impedance component 130 of the first configuration 142A. In plan view, current flows from the first joint 150A to the second joint 150B in a clockwise direction through the variable impedance component 130 of the first configuration 142A.

An opening is fabricated through the capping component 120 of the cryocooler 100 of the first configuration 142A and through the separation layer 148A. The joint 150B extends through the opening and is connected to the second contact 134 (see FIG. 13) of the variable impedance component 130 of the second configuration 142B. The third joint 150C is connected to the first contact 132 (see FIG. 13) of the variable impedance component 130 of the second configuration 142B. Current flowing from the second joint 150B to the third joint 150C follows a counter clockwise path through the variable impedance component 130 of the second configuration 142B.

The magnetic flux developed by the variable impedance component 130 of the first configuration 142A is in an upward direction, represented by the arrow 152A. The magnetic flux developed by the variable impedance component 130 of the second configuration 142B is in a downward direction represented by the arrow 152B.

In a similar manner, the third joint 150C is connected to the first contact 132 of the variable impedance component 130 of the third configuration 142C, the fourth joint 150D is connected between the second contacts 134 of the variable impedance components 130 of the third and fourth configurations 142C and D, and the fifth joint 150E is connected to the first contact 132 of the variable impedance component 130 of the fourth configuration 142D.

The variable impedance components 130 of the third and fourth configurations 142C and D have magnetic fields that are represented by the arrows 152C and D, respectively. Because an equal number of arrows point in an upward direction than arrows pointing in a downward direction, the magnetic fields cancel one another out to a large extent. As such, it is desirable to have an even number of the configurations 142A-D.

The variable impedance subassembly 140 further has a Joule-Thomson hydrogen compressor 154, a plurality of high pressure lines 156 and a plurality of low pressure lines 158. The high pressure lines 156 are connected in parallel to the hydrogen compressor 154 and feed the cryocoolers 100 of the configurations 142A-D in parallel. Similarly, the low pressure lines 158 receive fluid in parallel from the cryocoolers 100 and are all connected in parallel to the hydrogen compressor 154.

Figure 15:
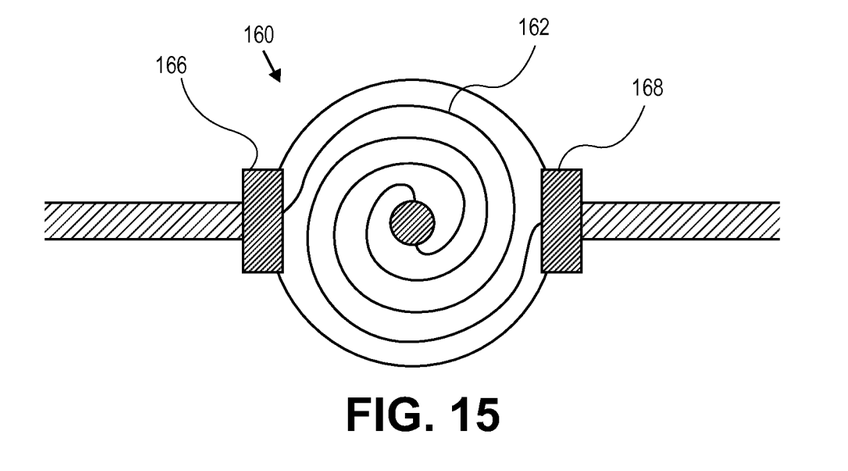
FIG. 15 is top plan view of a variable impedance component according to a further embodiment of the invention.

FIG. 15 illustrates a variable impedance component 160 according to a further embodiment of the invention. The variable impedance component 160 is manufactured in a bifilar geometry. The variable impedance component 160 has a first coil 162 that coils inwardly towards a center point and a second coil 164 that coils outwardly from the center point. Both coils 162 and 164 are located in the same plane. Current conducts in opposite directions through the coils 162 and 164, so that their magnetic fields cancel one another according to known principles. Contacts 166 and 168 are located on an outer perimeter of the variable impedance component 160 and are connected to the coils 162 and 164, respectively.

Figure 16:
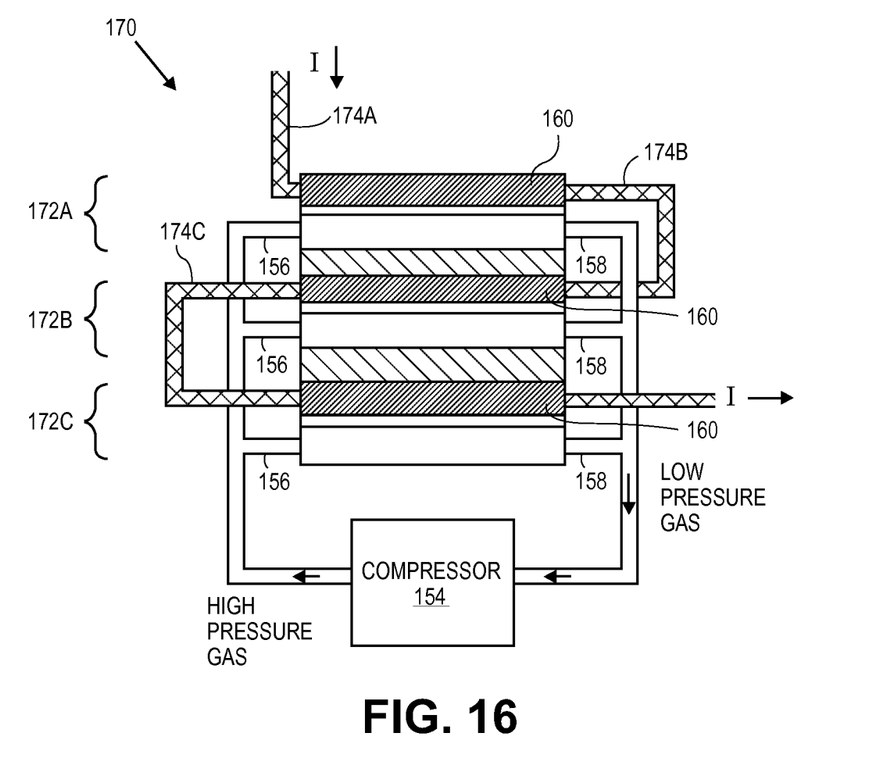
FIG. 16 is a cross-sectional side view of a variable impedance subassembly that includes a plurality of cooled variable impedance configurations, each including the variable impedance component of FIG. 15.

FIG. 16 shows a variable impedance subassembly 170 that has a plurality of variable impedance components 160 such as the variable impedance component 160 in FIG. 15. Each variable impedance component 160 forms part of a respective cooled variable impedance configuration 172A-C. First through fourth joints 174A-D interconnect the variable impedance components 160. The first and second joints 174A and 174B are connected to first and second contacts 166 and 168 (See FIG. 15) of a variable impedance component 160 of the first configuration 172A. The second and third joints 174C and 174D are connected to the second and first contacts 168 and 166, respectively (see FIG. 15), of the variable impedance component 160 of the second configuration 172B. The third and fourth joints 174C and D are connected to the first and second contacts 166 and 168, respectively, (see FIG. 15) of the variable impedance component 160 of the third configuration 172C. In the variable impedance subassembly 170 of FIG. 16, each one of the variable impedance components 160 has a bifilar arrangement so that the two coils thereof have magnetic fields that cancel one another out to a large extent. Because the fields of a single impedance component 160 largely cancel one another out, there is no need for reversing the direction of the magnetic field, as with an arrangement such as shown in FIG. 14. In the variable impedance subassembly 170 of FIG. 16, it is also possible to have an uneven number of variable impedance components 160 because one variable impedance component 160 does not cancel the magnetic field of another variable impedance component 160.

Figure 17:
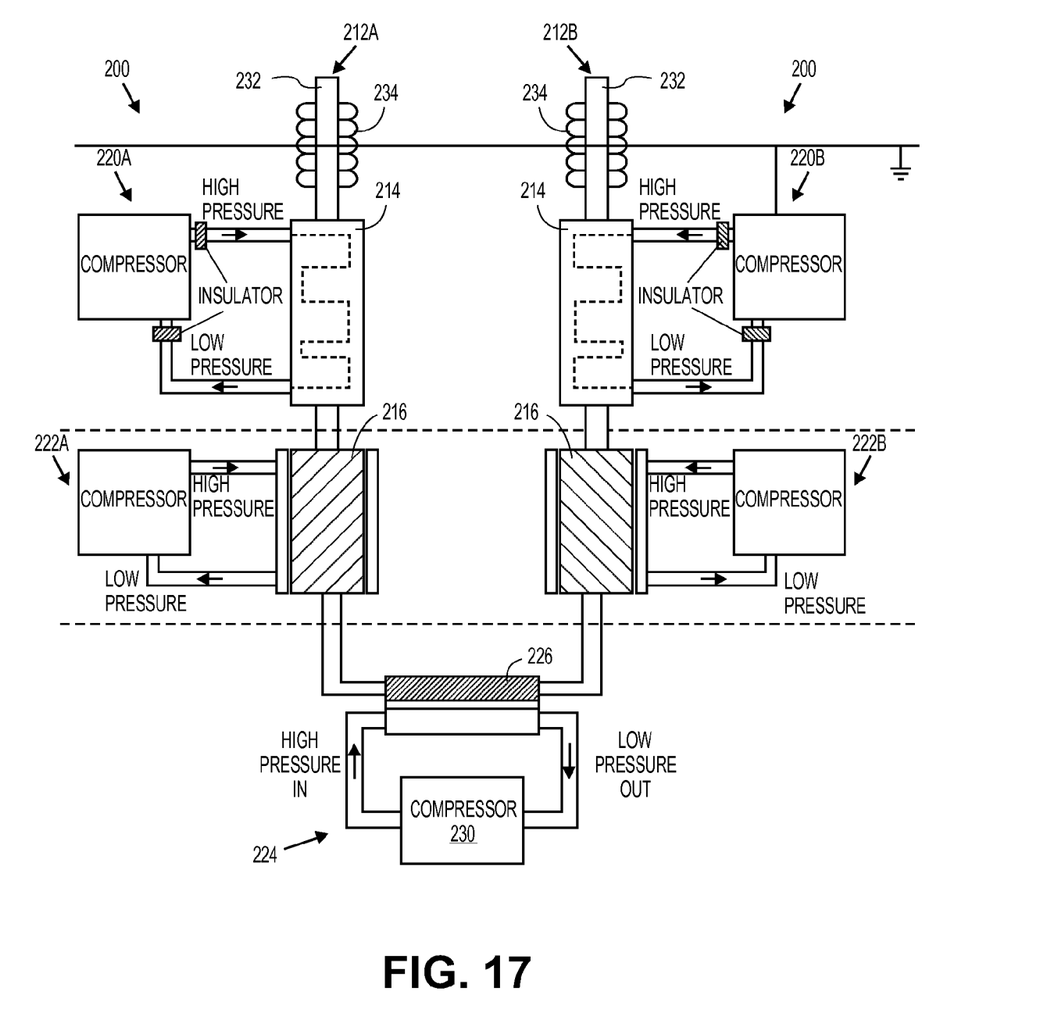
FIG. 17 is a partially cross-sectioned side view of a variable impedance device according to an alternate embodiment of the invention.

FIG. 17 illustrates a variable impedance device 200, according to an embodiment of the invention, including first and second bus bars 212A and B, each including a respective high-temperature lead 214 and a respective low temperature lead 216, a high temperature first bus bar refrigeration system 220A, a high temperature second bus bar refrigeration system 220B, a low temperature first bus bar refrigeration system 222A, a low temperature second bus bar refrigeration system 222B, and variable impedance subsystem 224.

The variable impedance subsystem 224 may for example be a subsystem such as the subsystems described in FIGS. 14 and 16. The subsystem 224 thus has one or more variable impedance components, represented in FIG. 17 by reference numeral 226. The variable impedance component or components 226 are connected in series with the bus bars 212A and 212B. Current can thus conduct between the bus bars 212A and 212B through the variable impedance component or components 226. The subsystem 224 also has a compressor 230 as described with reference to FIGS. 14 and 16.

The high temperature leads 214 are of the kind described with reference to FIG. 6. The high temperature first bus bar refrigeration system 220A and the high temperature second bus bar refrigeration system 220B are of the kind describe with reference to the high temperature first bus bar refrigeration system 20 in FIG. 1. The refrigeration systems 220A and 220B are used for cooling the high temperature leads 214 of the first and second bus bars 212A and 212B, respectively.

The low temperature first bus bar refrigeration system 222A and the low temperature second bus bar refrigeration 222B are of the kind described with reference to the low temperature first bus bar refrigeration system 22 in FIG. 1. The refrigeration systems 222A and 222B are used to cool the low temperature leads 216 of the first and second bus bars 212A and 212B, respectively.

The bus bars 212A and 212B have terminals 232. A high voltage bushing 234 is installed on each of the terminals 232.

In use, the terminals 232 are connected in an electrical circuit. The refrigeration systems 220A and 220B and 222A and 222B are used to cool the bus bars 212A and 212B as hereinbefore described. The variable impedance component 226 is cooled to a temperature below its superconducting critical temperature. Superconducting current then flows through the variable impedance component 226 between the terminals 232.

An over current, or fault current, will cause the material of the variable impedance component 226 to transition from a superconducting state to a resistive state and subsequently heat above its critical temperature. Such heating will terminate the superconducting characteristics of the variable impedance component 226 so that it becomes resistive. By inserting impedance into the electrical circuit via the superconducting to resistive transition, the current that passes through the variable impedance component 226 reduces in magnitude. When the fault condition is removed, the variable impedance component 226 again cools to below its critical temperature and becomes superconducting. The magnitude of the superconducting current then increases. The impedance of the variable impedance device 200 is a function of the current passing through the device. The impedance is high during over current, fault conditions, and very low during normal current conditions. In this manner, the variable impedance device 200 is used to control the fault, in nearly constant voltage electrical circuits such as the electric power grid, by controlling the current via an impedance that is strongly dependent on the magnitude of the current passing through the variable impedance component 226.

The integrated nature of the refrigeration systems 220A and 220B, 222A and 222B and the refrigeration system of the variable impedance subsystem 224 create a cascading system in which each stage provides a high degree of refrigeration capacity at a specific target operating temperature or target temperature range. The integrated nature of the refrigeration also saves space and reduces refrigeration power requirements. The cascading nature of the refrigeration also reduces losses at the terminals 232.

The variable impedance device 200 may also be used as a switch that is used to actively increase and reduce current within a circuit. The current within the variable impedance component 226 may be switched on through heating or by increasing a magnetic field near the variable impedance component 226. In situations where such a circuit is located within a moving structure, the integrated nature of the refrigeration may be used instead of immersing the bus bars 212A and 212B in one or more cryogenic baths.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In another embodiment, for example, the variable impedance device may be cooled by a single-stream, throttle expansion refrigeration system and an integral helium Pulse Tube cryocooler, without the need for the intermediate Nitrogen Joule Thomson refrigeration system.

What is claimed:
1. A variable impedance device comprising:
a first bus bar refrigeration system;
a first bus bar thermally connected to the first bus bar refrigeration system to be maintained at a target bus bar temperature by the first bus bar refrigeration system;
a variable impedance component refrigeration system;
a variable impedance component electrically connected to the first bus bar and thermally connected to the component refrigeration system, the variable impedance component being at least partially made of a material that is superconducting below a critical temperature and being maintained at a target component temperature, wherein the target bus bar temperature is between the 300K and critical temperature and the target component temperature is below the critical temperature; and
a second bus bar connected to the variable impedance component so that current flows between the first and second leads through the variable impedance component.

2. The variable impedance device of claim 1, wherein the first bus bar refrigeration system is a high-temperature first bus bar refrigeration system thermally connected to a high-temperature lead of the first bus bar, further comprising:
a low-temperature first bus bar refrigeration system thermally connected to a low-temperature lead of the first bus bar, the high temperature lead being maintained at a high target temperature and the low-temperature lead being maintained at a low target temperature by the high-temperature first bus bar refrigeration system and the low-temperature first bus bar refrigeration system respectively.

3. The variable impedance device of claim 2, wherein the variable impedance component refrigeration system is a hydrogen Joule-Thomson expansion refrigeration system and the low-temperature first bus bar refrigeration system is a nitrogen Joule-Thomson refrigeration system.

4. The variable impedance device of claim 3, wherein the high-temperature first bus bar refrigeration system is selected from the group consisting of a mixed gas refrigeration system, a pulse tube refrigeration system, and a Gifford-McMahon refrigeration system.

5. The variable impedance device of claim 1, wherein the first bus bar has a fluid passage therethrough and the first bus bar refrigeration system is a closed cycle system with the fluid passage forming part of the closed cycle.

6. The variable impedance device of claim 5, wherein the first bus bar includes:
an electrically conductive body with a first channel formed in a first surface of the body; and
a first sealing plate over the first surface of the body, the passage having a first portion jointly defined by the channel in the first surface and a surface of the first sealing plate.

7. The variable impedance device of claim 6, wherein the body has a second channel formed in a second opposing surface thereof, the first bus bar further including:
a second sealing plate over the second surface of the body, the passage having a second portion jointly defined by the channel in the second surface and a surface of the second sealing plate.

8. The variable impedance device of claim 5, further comprising an expansion port in the fluid passage to form a cryocooler.

9. The variable impedance device of claim 1, wherein the variable impedance component refrigeration system includes:
a heat exchanger with a fluid passage formed therein, the fluid passage having first and second portions and an expansion valve connection the first and second portions to form a cryocooler.

10. The variable impedance device of claim 9, wherein the first and second portions of the passage are coils.

11. The variable impedance device of claim 10, wherein a section of the second portion of the fluid passage is located between two sections of the first portion of the fluid passage.

12. The variable impedance device of claim 10, wherein the first portion of the fluid passage coils inwards towards a center point and the second portion of the fluid passage coils outward from the center point.

13. The variable impedance device of claim 12, wherein the expansion port is located at the center point.

14. The variable impedance device of claim 9, wherein the heat exchanger further includes:
a body with a channel formed therein and a capping component on the body, the fluid passage being defined by the channel and a surface of the capping component.

15. The variable impedance device of claim 9, wherein the material of the variable impedance component is deposited on the heat exchanger.

16. The variable impedance device of claim 1, further comprising:
a second bus bar refrigeration system, the second bus bar being thermally connected to the second bus bar refrigeration system to be maintained at the target bus bar temperature.

17. The variable impedance device of claim 16, wherein the second bus bar refrigeration system is a high-temperature second bus bar refrigeration system thermally connected to a high-temperature lead of the second lead, further comprising:
a low-temperature second bus bar refrigeration system thermally connected to a low-temperature lead of the second lead, the high temperature lead being maintained at a high target temperature and the low-temperature lead being maintained at a low target temperature by the high-temperature second bus bar refrigeration system and the low-temperature second bus bar refrigeration system respectively.

18. The variable impedance device of claim 1, wherein the variable impedance component refrigeration system is one of a hydrogen Joule-Thomson expansion refrigeration system and a helium Pulse Tube refrigeration system.

19. A method of varying a magnitude of current, comprising:
maintaining a first bus bar at a first temperature using a first refrigeration system;
maintaining a variable impedance component that is at least partially made of a material that is superconducting below a critical temperature at a second temperature, the first temperature being between 300K and the critical temperature and the second temperature being below the critical temperature;
passing current between the first and a second bus bar through the variable impedance component connected between the first and second leads; and
increasing an impedance of the variable impedance component so that the current switches from superconducting current to resistive current through the variable impedance component.

20. A variable impedance subsystem comprising:
at least a first configuration including:
a cryocooler having a heat exchanger with a fluid passage formed therein, the fluid passage having first and second portions, each portion being in the form of a respective coil;
an expansion valve connecting the first and second portions; and
a variable impedance component on the cryocooler, the variable impedance component at least partially made of a material that is superconducting below a critical temperature.

21. The variable impedance subsystem of claim 20, wherein the material is $MgB_2$.

22. A method of making a variable impedance subsystem, comprising:
forming a channel in a body of the cryocooler;
forming an expansion port in the channel; and securing a capping component over the channel so that the channel and a surface of the capping component form a passage having first and second portions with the expansion port connecting the portions; and depositing a material on the cryocooler, the material being superconducting below a critical temperature.

23. A variable impedance subassembly comprising:
a plurality of cooled variable impedance configurations adjacent one another, each configuration including:
a heat exchanger; and
a variable impedance component against the heat exchanger, the variable impedance component being made of a material that is superconducting between a critical temperature and the heat exchanger being configured to cool the variable impedance component to below the critical temperature,
at least one electrically conductive link connecting the variable impedance component of a first of the configurations with the variable impedance component of a second of the configurations.

24. The variable impedance subassembly of claim 23, wherein the variable impedance component of each configuration is in the form of at least one spiral coil.

25. The variable impedance subassembly of claim 24, comprising first, second and third of said configurations and first and second electrically conductive links, wherein the first electrically conductive link connects a center of the spiral coil of the first configuration with a center of the spiral coil of the second configuration, and the second electrically conductive coil connects an outer portion of the spiral coil of the second configuration with an outer portion of the spiral coil of the third configuration.

26. The variable impedance subassembly of claim 24, wherein a magnetic flux field of the spiral coil of a first of the configurations opposes a magnetic flux field of a spiral coil of the second configuration.

27. The variable impedance subassembly of claim 24, wherein the variable impedance component of each configuration is in a bifilar configuration with first and second spirals in a common plane.

* * * * *